(12) United States Patent
Cho

(10) Patent No.: US 7,705,360 B2
(45) Date of Patent: Apr. 27, 2010

(54) ARRAY SUBSTRATE FOR DISPLAY DEVICE AND METHOD OF MANUFACTURING THE SAME

(75) Inventor: Young-Joon Cho, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/178,967

(22) Filed: Jul. 24, 2008

(65) Prior Publication Data

US 2009/0261336 A1 Oct. 22, 2009

(30) Foreign Application Priority Data

Apr. 21, 2008 (KR) .................... 10-2008-0036727

(51) Int. Cl.
| | |
|---|---|
| H01L 29/04 | (2006.01) |
| H01L 29/15 | (2006.01) |
| H01L 31/036 | (2006.01) |
| H01L 29/786 | (2006.01) |
| H01L 29/10 | (2006.01) |
| H01L 31/0376 | (2006.01) |
| H01L 31/20 | (2006.01) |
| H01L 27/108 | (2006.01) |
| H01L 29/12 | (2006.01) |
| H01L 29/76 | (2006.01) |
| H01L 31/112 | (2006.01) |
| H01L 31/062 | (2006.01) |
| H01L 31/113 | (2006.01) |

(52) U.S. Cl. ............................. 257/72; 257/59; 257/68; 257/71; 257/291; 257/E27.1; 257/E27.13; 257/E27.131; 257/E27.132; 257/E29.151

(58) Field of Classification Search ................... 257/59, 257/68, 71–72, E27.1, E27.13, E27.131, 257/E27.132, E29.151
See application file for complete search history.

(56) References Cited

U.S. PATENT DOCUMENTS

| | | | | |
|---|---|---|---|---|
| 7,001,796 | B2 * | 2/2006 | Cho et al. | 438/104 |
| 7,166,864 | B2 * | 1/2007 | Ahn et al. | 257/72 |
| 7,495,728 | B2 * | 2/2009 | Kim et al. | 349/114 |
| 7,589,801 | B2 * | 9/2009 | Yoon | 349/43 |
| 2001/0010567 | A1 * | 8/2001 | Rho et al. | 349/43 |
| 2008/0121875 | A1 * | 5/2008 | Kim | 257/40 |
| 2008/0266479 | A1 * | 10/2008 | Lim | 349/46 |
| 2008/0278648 | A1 * | 11/2008 | Chang | 349/40 |

FOREIGN PATENT DOCUMENTS

| | | |
|---|---|---|
| JP | 7152041 | 6/1995 |
| KR | 1020020018883 | 3/2002 |
| KR | 1020050026667 | 3/2005 |

\* cited by examiner

*Primary Examiner*—Ida M Soward
(74) *Attorney, Agent, or Firm*—Innovation Counsel LLP

(57) ABSTRACT

An array substrate includes a substrate, a data line formed on the substrate, a passivation layer formed on the data line, a gate line including a gate electrode and a capacitor line formed on the passivation layer, a gate insulation layer formed on the gate electrode and the capacitor line, a semiconductor layer formed on the gate insulation layer, a contact hole formed through the passivation layer and the gate insulation layer to expose the data line and a source electrode and a drain electrode formed on the semiconductor layer. The capacitor electrode is overlapped with the data line. The source electrode is connected to the data line through the contact hole and the source electrode and the drain electrode include a transparent conductive material.

8 Claims, 11 Drawing Sheets

ARRAY SUBSTRATE FOR DISPLAY DEVICE AND METHOD OF MANUFACTURING THE SAME

CROSS-REFERENCE TO RELATED APPLICATION

The present application claims priority under 35 U.S.C. §119 to Korean Patent Application No. 10-2008-0036727, filed on Apr. 21, 2008, the disclosure of which is incorporated herein by reference.

BACKGROUND OF THE INVENTION

1. Technical Field

The present disclosure relates to an array substrate for a display device and method of manufacturing a display device, and more particularly, to an array substrate capable of enhancing an aperture ratio.

2. Discussion of the Related Art

A liquid crystal display (LCD) device which is one of the flat panel display devices includes an array substrate, a countering substrate facing the array substrate and a liquid crystal layer interposed between the array substrate and the countering substrate. The LCD device is provided with a pixel electrode and a common electrode to apply an electric field to each liquid crystal cell. The pixel electrode is formed on the array substrate, whereas the common electrode is formed on the countering substrate. Each of the pixel electrodes is connected to a drain electrode of a thin film transistor (TFT). The pixel electrode along with the common electrode drives the liquid crystal cell by applying an electric filed in response to a data signal applied via the TFT.

Since an arrangement of liquid crystals in the liquid crystal layer can be adjusted by an electric field, a light transmittance of the liquid crystal layer is changed, thereby displaying an image.

In order to improve a brightness of the LCD device, an aperture ratio of the LCD device is required to be increased. However, the aperture ratio is reduced since a distance between the pixel electrode and a data line is maintained to avoid the parasitic capacitance generated by a coupling effect therebetween, and since a wide black matrix is required to cover a possible misalignment of the two substrates.

SUMMARY OF THE INVENTION

Exemplary embodiments of the present invention provide a method of manufacturing a display substrate capable of enhancing an aperture ratio and an array substrate for a display device using the same.

According to an exemplary embodiment of the present invention, an array substrate includes a substrate, a data line formed on the substrate, a passivation layer formed on the data line, a gate line including a gate electrode and a capacitor line formed on the passivation layer, a gate insulation layer formed on the gate electrode and the capacitor line, a semiconductor layer formed on the gate insulation layer, a contact hole formed through the passivation layer and the gate insulation layer to expose the data line, and a source electrode and a drain electrode formed on the semiconductor layer. The capacitor electrode is overlapped with the data line. The source electrode is connected to the data line through the contact hole and the source electrode and the drain electrode comprises a transparent conductive material.

The drain electrode comprises a pixel electrode formed on the gate insulation layer.

The pixel electrode comprises one of a reflective conductive material, a transflective conductive material, indium tin oxide (ITO) and indium zinc oxide (IZO).

A width of the capacitor line is wider than a width of the data line.

According to an exemplary embodiment of the present invention, a display device includes a first substrate, a second substrate including a black matrix and a liquid crystal layer interposed between the first substrate and the second substrate. The first substrate includes a data line formed on the substrate, a passivation layer formed on the data line, a gate line including a gate electrode and a capacitor line that is formed on the passivation layer and is overlapped with the data line, a gate insulation layer formed on the gate electrode and the capacitor line, a semiconductor layer formed on the gate insulation layer, a contact hole formed through the passivation layer and the gate insulation layer to expose the data line, and a source electrode and a drain electrode formed on the semiconductor layer. The drain electrode includes a pixel electrode formed on the gate insulation layer, and a width of adjacent pixel electrodes being narrower than a width of the black matrix, a width of the capacitor line and a width of the data line.

The source electrode and the drain electrode include a transparent conductive material.

The transparent conductive material includes one of a reflective conductive material, a transflective conductive material, indium tin oxide (ITO) and indium zinc oxide (IZO).

A width of the capacitor line is wider than a width of the data line.

According to an exemplary embodiment of the present invention, a method of manufacturing an array substrate includes forming a data line on a substrate, forming a passivation layer on the data line, forming a gate line including a gate electrode and a capacitor line on the passivation layer, forming a gate insulation layer on the gate electrode and the capacitor line, forming a semiconductor layer on the gate insulation layer, forming a contact hole through the passivation layer and the gate insulation layer to expose the data line, and a source electrode and a drain electrode on the semiconductor layer. The capacitor electrode is overlapped with the data line. The source electrode is connected to the data line through the contact hole and the source electrode and the drain electrode include a transparent conductive material.

The method of manufacturing an array substrate further includes forming an ohmic contact layer between the semiconductor layer and the source electrode and the drain electrode.

The transparent conductive material comprises one of a reflective conductive material, a transflective conductive material, indium tin oxide (ITO) and indium zinc oxide (IZO).

A width of the capacitor line is wider than a width of the data line.

According to an exemplary embodiment of the present invention, a method of manufacturing a display device includes forming a first substrate, forming a second substrate including a black matrix, and forming a liquid crystal layer between the first substrate and the second substrate.

Forming the first substrate includes forming a data line on the substrate, forming a passivation layer on the data line, forming a gate line including a gate electrode and a capacitor line that is formed on the passivation layer and is overlapped with the data line, forming a gate insulation layer on the gate electrode and the capacitor line, forming a semiconductor layer on the gate insulation layer, forming a contact hole through the passivation layer and the gate insulation layer to expose the data line, and forming a source electrode and a drain electrode on the semiconductor layer.

The drain electrode includes a pixel electrode formed on the gate insulation layer, and a width of adjacent pixel electrodes being narrower than a width of the black matrix, a width of the capacitor line and a width of the data line.

The method of the display device further includes forming an ohmic contact layer between the semiconductor layer and the source electrode and the drain electrode.

The pixel electrode includes one of a reflective conductive material, a transflective conductive material, indium tin oxide (ITO) and indium zinc oxide (IZO).

A width of the capacitor line is wider than a width of the data line. The capacitor line entirely covers the data line.

BRIEF DESCRIPTION OF THE DRAWINGS

Exemplary embodiments of the present invention can be understood in more detail from the following descriptions taken in conjunction with the accompanying drawings, in which.

DESCRIPTION OF THE EXEMPLARY EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein.

Figure 1:
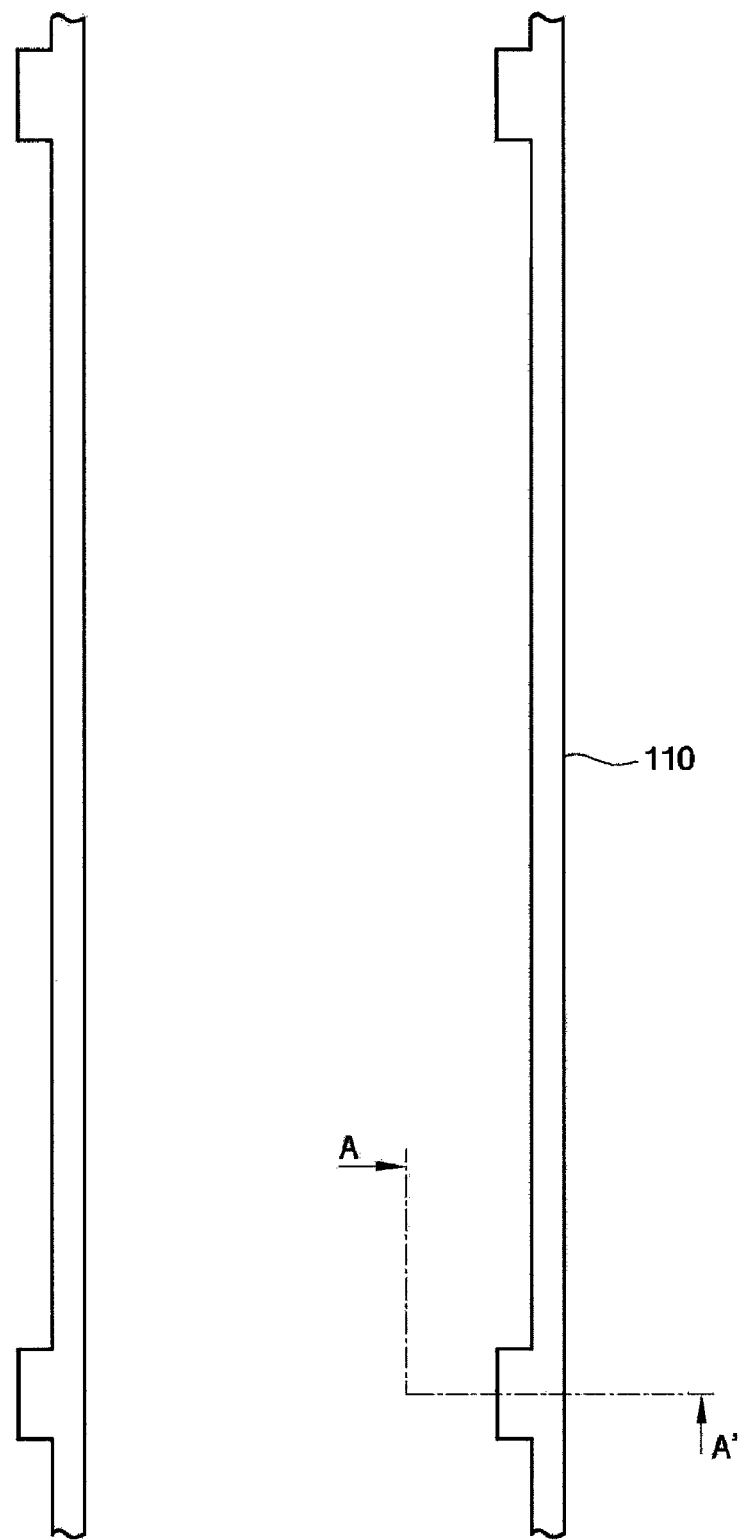
FIG. 1 is a plan view of an array substrate according to an exemplary embodiment of the present invention.
Figure 2:
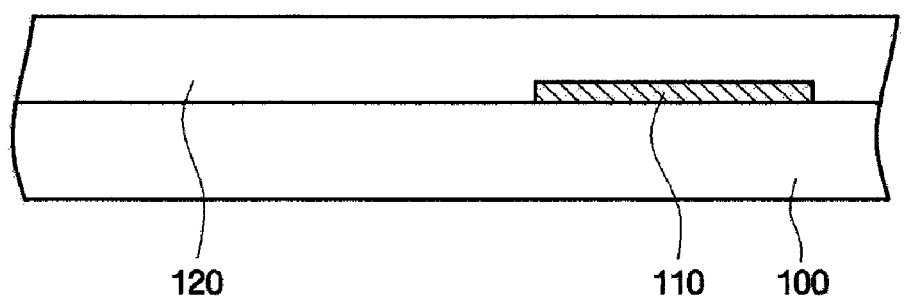
FIG. 2 is a cross-sectional view taken along a line A-A' of FIG. 1.

FIG. 1 is a plan view of an array substrate according to an exemplary embodiment of the present invention. FIG. 2 is a cross-sectional view taken along a line A-A' of FIG. 1.

Referring to FIGS. 1 to 2, an array substrate 10 includes a substrate 100, a data line 110 formed on the substrate 100 and a passivation layer 120 formed on the data line 110.

The substrate 100 may include, for example, transparent glass to pass through light. The glass may have a non-alkaline characteristic. The substrate 100 may include transparent synthetic resin such as, for example, triacetylcellulose TAC, polycarbonate PC, polyethersulfone PES, polyethylene-terephthalate PET, polyethylenenaphthalate PEN, polyvinylalcohol PVA, polymethylmethacrylate PMMA and cycloolefin polymer COP. The data line 110 may include, for example, a conductive material. The conductive material having a low resistivity may include, for example, an aluminum-based material, a copper-base material, a silver-base material, a molybdenum-based material, and a titanium-base material. The data line 110 may include, for example, a single-layered structure as well as a multiple-layered structure. The multiple-layered structure may include a first layer having a low resistivity and a good contacting property. The data line 110 may further include a data pad (not shown). The passivation layer 120 may include an insulation layer, for example, an organic insulation layer, silicon nitride, or an acrylic-based material.

Figure 3:
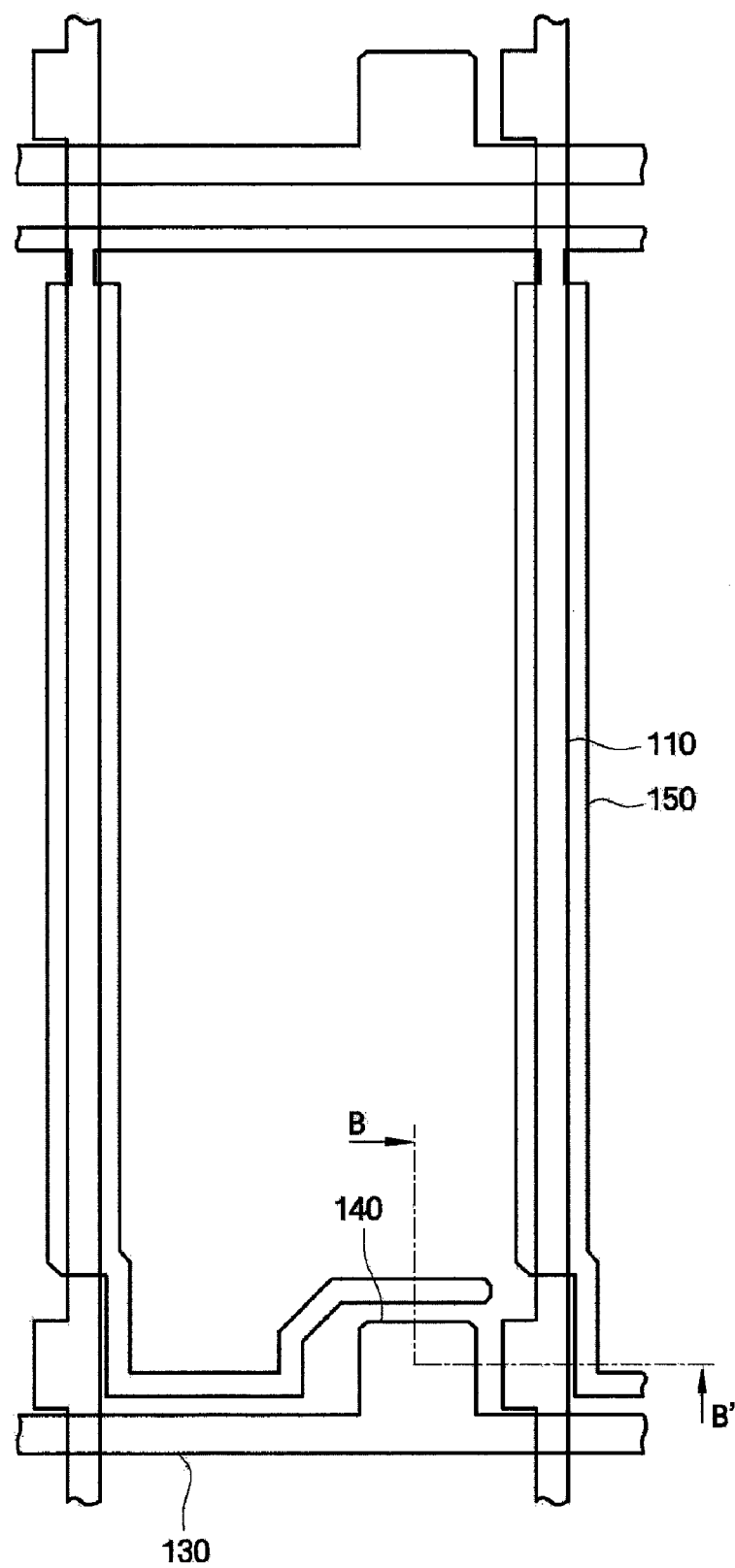
FIG. 3 is a plan view of an array substrate according to an exemplary embodiment of the present invention.
Figure 4:
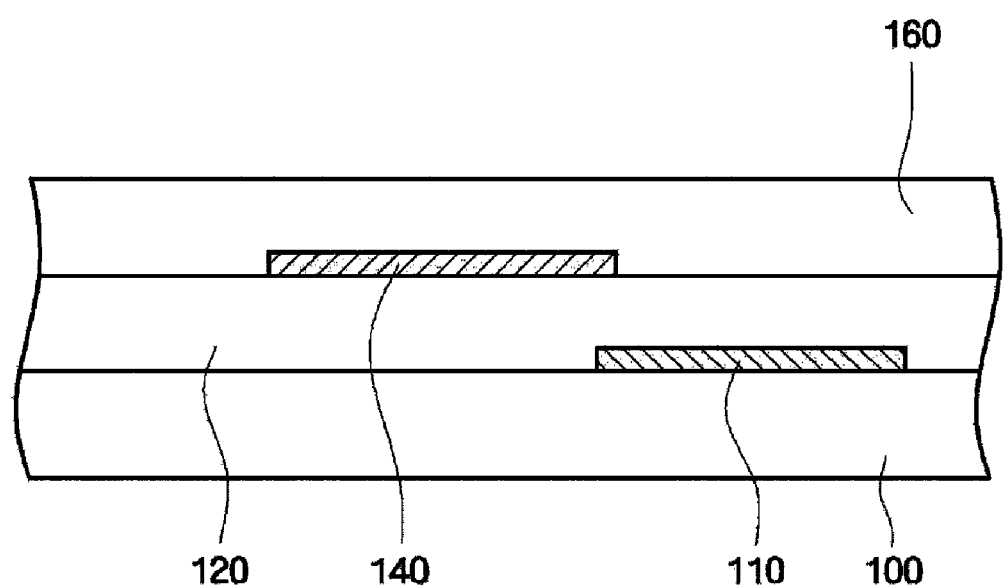
FIG. 4 is a cross-sectional view taken along a line B-B' of FIG. 3.

FIG. 3 is a plan view of an array substrate according to an exemplary embodiment of the present invention. FIG. 4 is a cross-sectional view taken along a line B-B' of FIG. 3.

Referring to FIGS. 3 to 4, a gate line 130 including a gate electrode 140 and a capacitor line 150 are formed on the passivation layer 120. A gate insulation layer 160 is formed on the gate line 130 and the capacitor line 150.

The gate lines 130 are extended substantially parallel with each other.

The gate line 130 may include, for example, metal or a conductive material such as aluminum (Al), aluminum alloy, molybdenum (Mo), molybdenum alloy, chromium (Cr), chromium alloy, tantalum (Ta), tantalum alloy, copper (Cu) or copper alloy. The gate line 130 may include, for example, a single-layered structure as well as a multiple-layered structure. The multiple-layered structure may include a first layer having a low resistivity and a good contacting property. The gate line 130 may further include a gate pad.

In an exemplary embodiment, the gate electrode 140 is not overlapped with the data line 110.

The capacitor line 150 is overlapped with the data line 110. In an exemplary embodiment, a width of the capacitor line 150 is wider than a width of the data line 110 so that the capacitor line 150 entirely covers the data line 110. The capacitor line 150 may be formed by a same material of the gate line 130.

The gate insulation layer 160 may include an insulation layer, for example, an organic insulation layer, a silicon nitride layer (SiNx), a silicon oxide layer (SiOx), or an acrylic-based material. In an exemplary embodiment, the gate insulation layer 160 may include a multiple-layered structure. The multiple-layered structure may include, for example, a first gate insulation layer (not shown) having a first dielectric property and a second gate insulation layer (not shown) having a second dielectric property.

Figure 5:
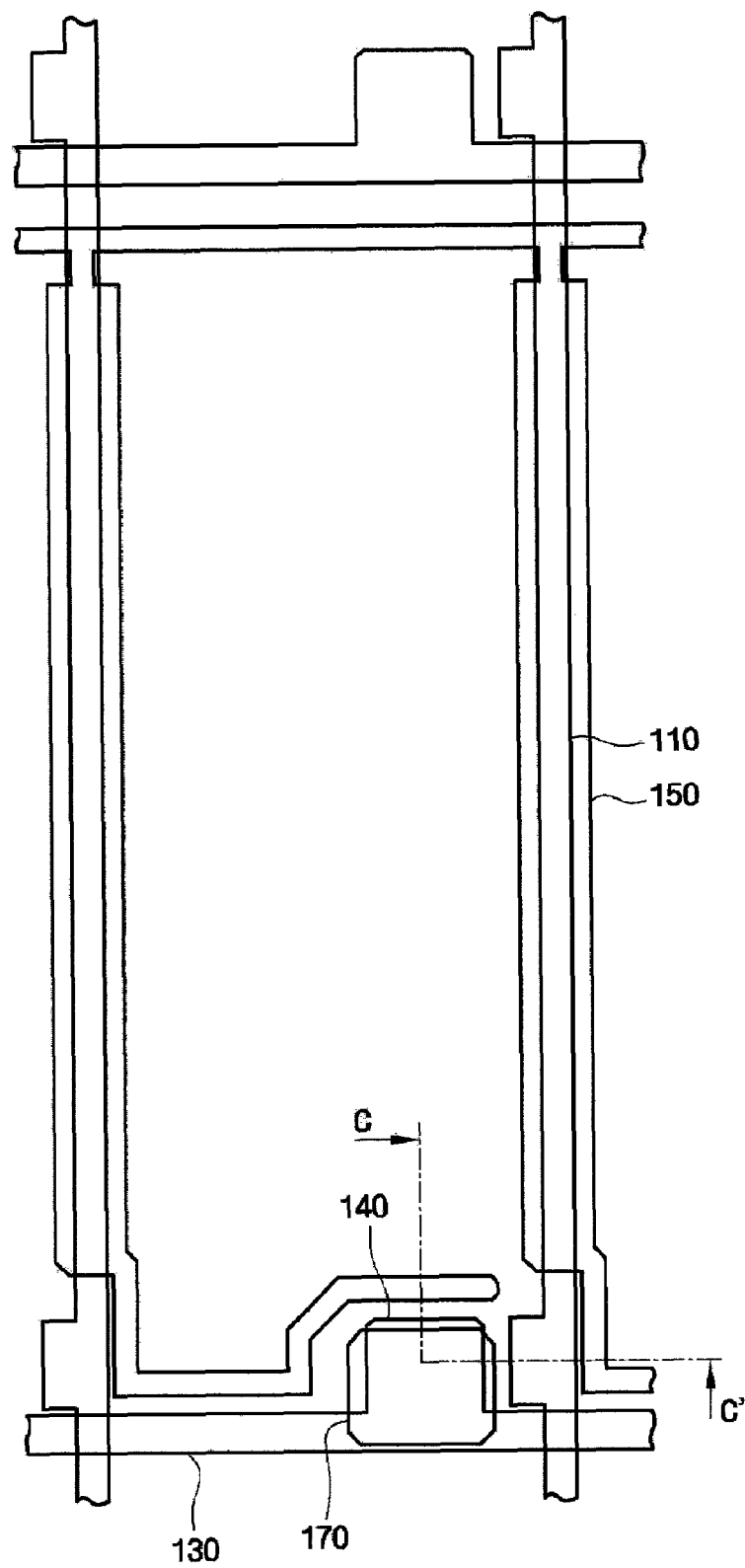
FIG. 5 is a plan view of an array substrate according to an exemplary embodiment of the present invention.
Figure 6:
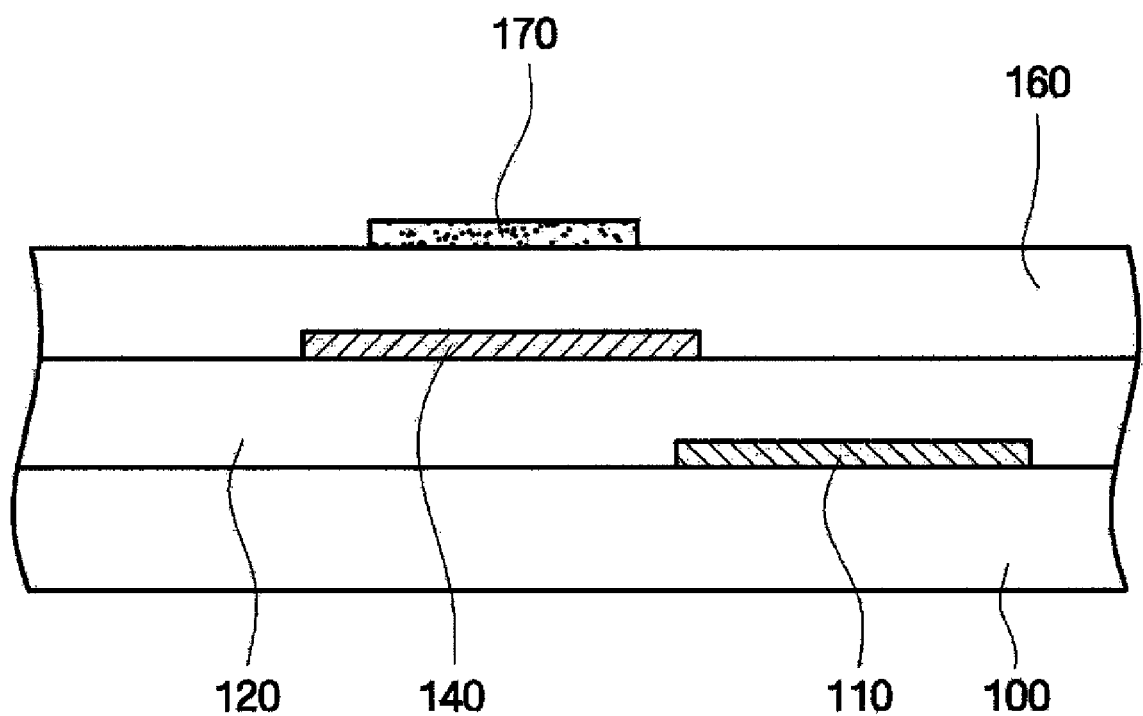
FIG. 6 is a cross-sectional view taken along a line C-C' of FIG. 5.

FIG. 5 is a plan view of an array substrate according to an exemplary embodiment of the present invention. FIG. 6 is a cross-sectional view taken along a line C-C' of FIG. 5.

Referring to FIGS. 5 and 6, a semiconductor layer 170 that functions as an active layer is formed on the gate insulation layer 160. The semiconductor layer 170 is formed in an island shape on the gate insulation layer 160. The semiconductor layer 170 may include, for example, amorphous silicon or polycrystalline silicon. In addition, the semiconductor layer 170 may include a mixed oxide, such as ZnO, InZnO, InGaO, InSnO, ZnSnO, GaSnO, GaZnO, or GaInZnO. The mixed oxide for the semiconductor layer 170 has good ohmic contact characteristics to the source electrode 210 and the drain electrode 220, such that an ohmic contact layer is not needed.

An ohmic contact layer (not shown) may be formed on the semiconductor layer 170. The ohmic contact layer is divided with respect to the gate electrode 140. The ohmic contact layer may include, for example, silicide of metal, N+ amorphous silicon or doped microcrystallized amorphous silicon.

Figure 7:
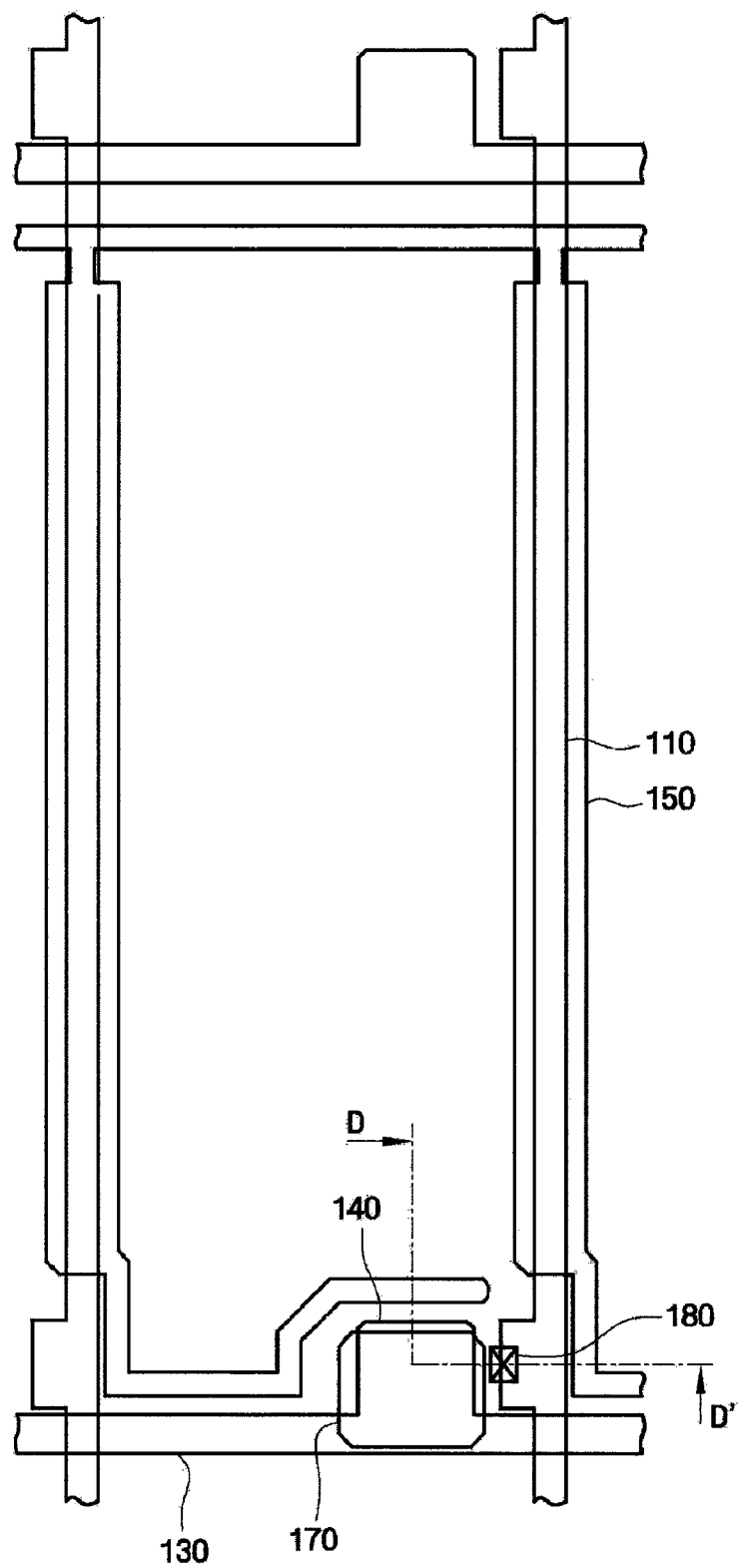
FIG. 7 is a plan view of an array substrate according to an exemplary embodiment of the present invention.
Figure 8:
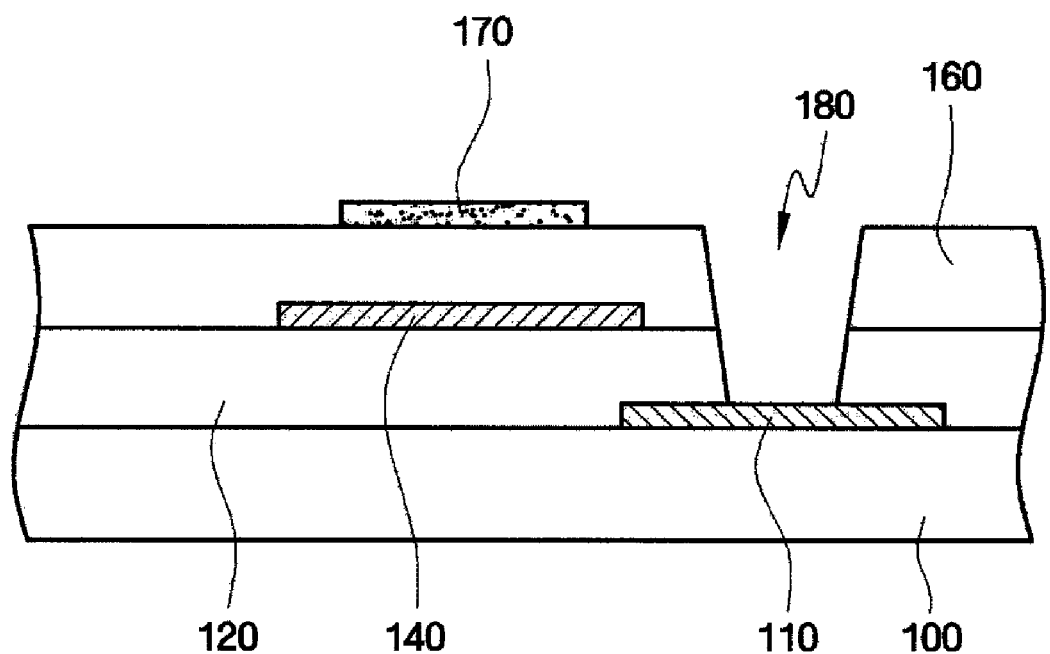
FIG. 8 is a cross-sectional view taken along a line D-D' of FIG. 7.

FIG. 7 is a plan view of an array substrate according to an exemplary embodiment of the present invention. FIG. 8 is a cross-sectional view taken along a line D-D' of FIG. 7.

Referring to FIGS. 7 and 8, a first contact hole 180 is formed through the passivation layer 120 and the gate insulation layer 160 to expose the data line 120. A second contact hole (not shown) and a third contact hole (not shown) may be formed through the passivation layer 120 and the gate insulation layer 160 to expose the gate pad and the data pad.

Figure 9:
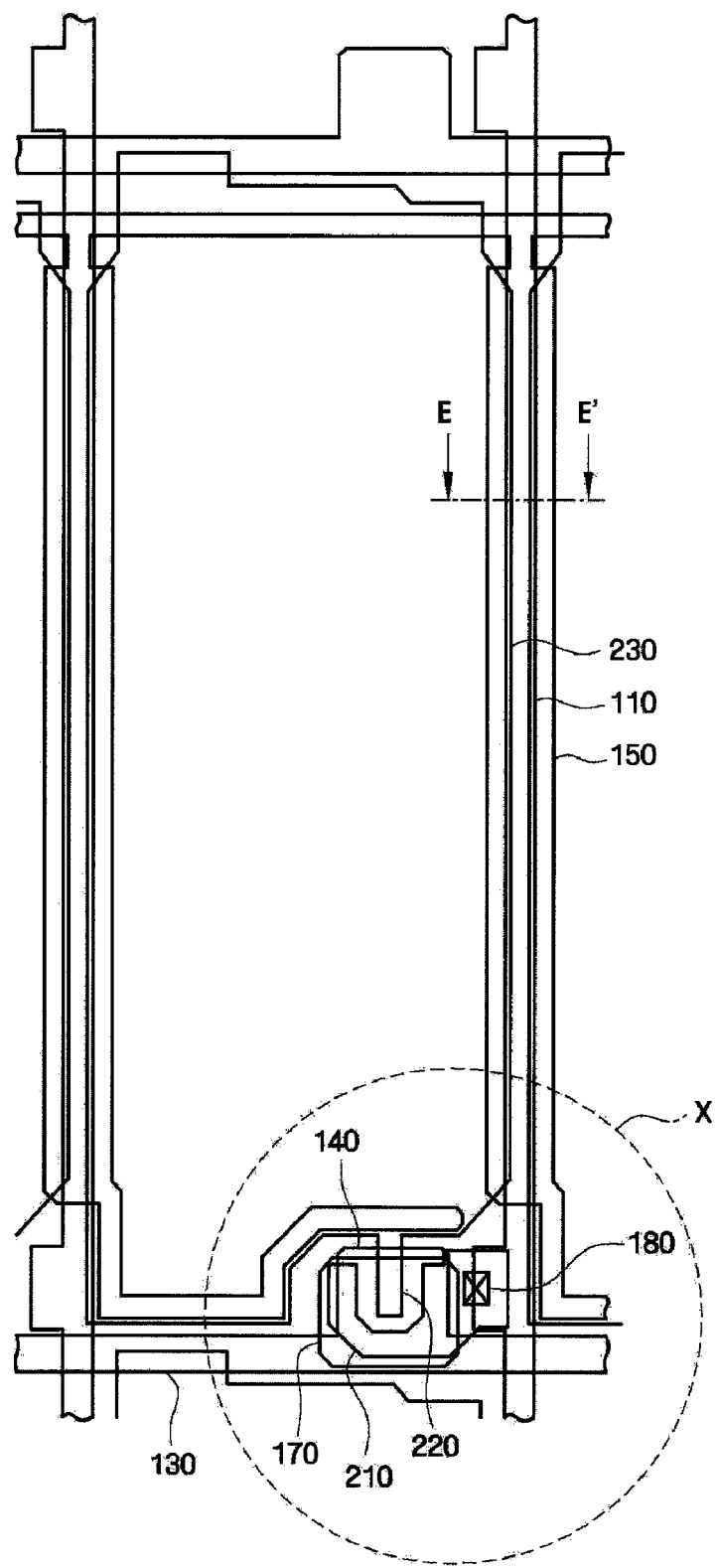
FIG. 9 is a plan view of an array substrate according to an exemplary embodiment of the present invention.
Figure 10:
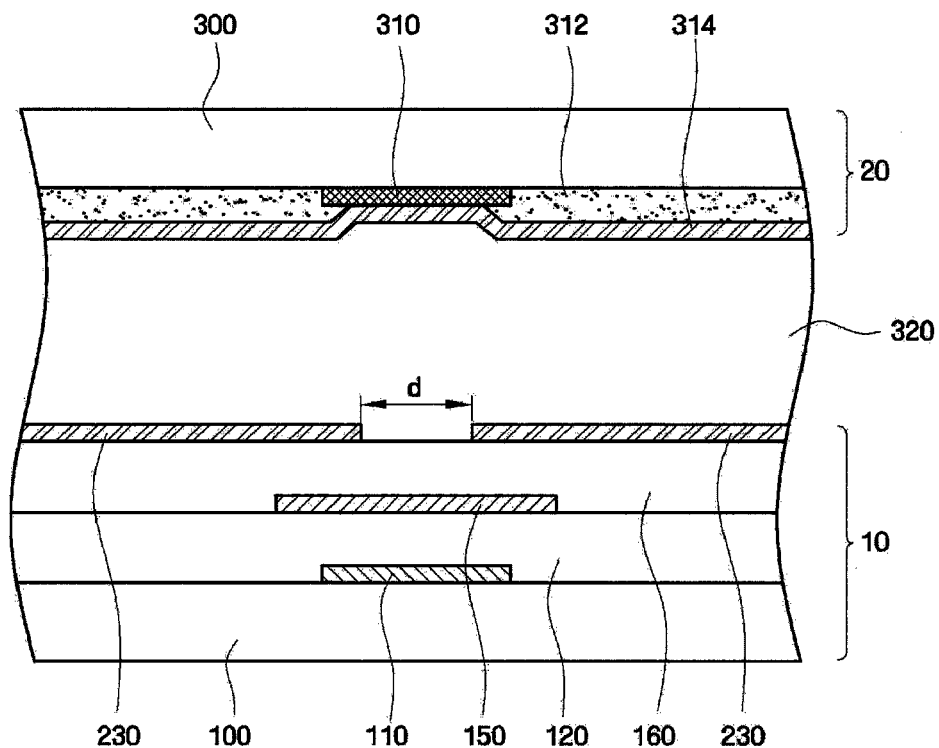
FIG. 10 is a cross-sectional view taken along a line E-E' of FIG. 9.
Figure 11:
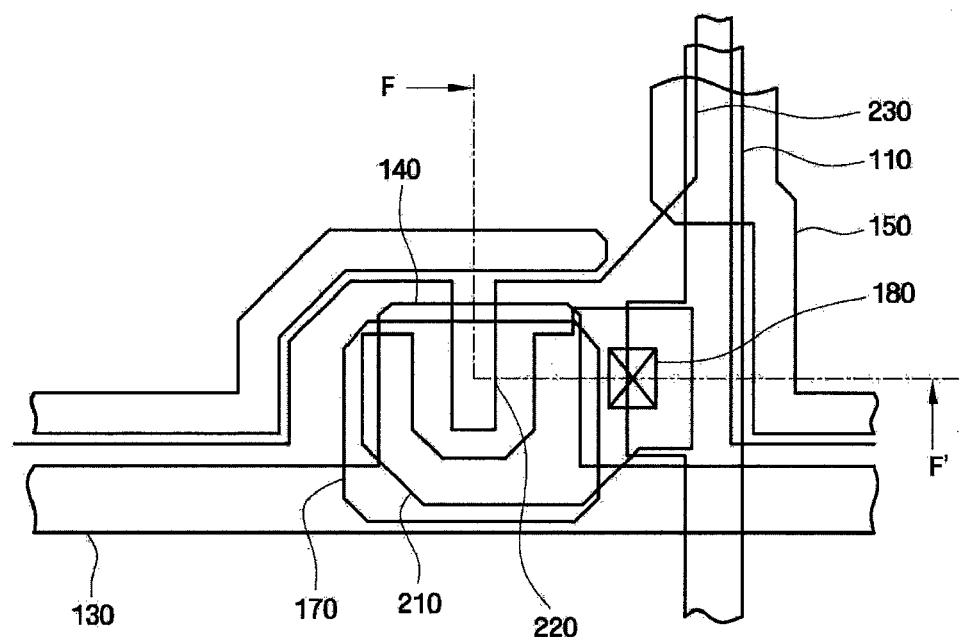
FIG. 11 is an enlarged plan view showing a portion X of FIG. 9.
Figure 12:
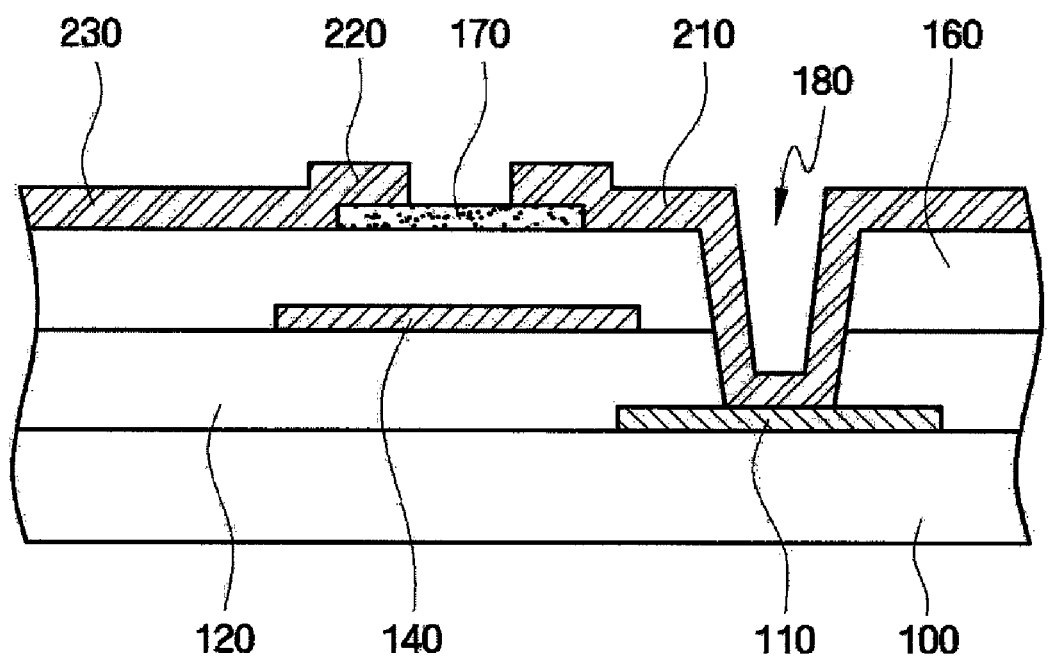
FIG. 12 is a cross-sectional view taken along a line F-F' of FIG. 11.

FIG. 9 is a plan view of an array substrate according to an exemplary embodiment of the present invention. FIG. 10 is a cross-sectional view taken along a line E-E' of FIG. 9. FIG. 11 is an enlarged plan view showing a portion X of FIG. 9. FIG. 12 is a cross-sectional view taken along a line F-F' of FIG. 11.

Referring to FIGS. 9 through 12, a source electrode 210 and a drain electrode 220 are formed on the semiconductor layer 170 and the gate insulation layer 160. The source electrode 210 and the drain electrode 220 may include a transparent conductive material.

The source electrode 210 is electrically connected to the data line 110 through the first contact hole 180.

The drain electrode 220 may include a pixel electrode 230 formed on the gate insulation layer 160. The pixel electrode 230 may include, for example, a reflective conductive layer, a transflective conductive layer, indium tin oxide (ITO) or indium zinc oxide (IZO).

Referring to FIG. 10, a countering substrate 20 includes a black matrix 310. A liquid crystal layer 320 is disposed between the array substrate 10 and the countering substrate 20.

The black matrix 310 can block light leakage.

In an exemplary embodiment, a distance d of adjacent pixel electrodes 231, 232 is narrower than a width of the black matrix 310, a width of the capacitor line 150 and a width of the data line 110.

In one embodiment of the invention, a conductive layer (not shown) is formed on a substrate 100. A photo resist layer (not shown) is formed on the conductive layer. The photo resist layer is patterned to form a photolithography mask (not shown). Then, the conductive layer is patterned through the photolithography mask to form a data line 110 as illustrated in FIG. 2.

An insulation layer is coated on the substrate 100 having the data line 110 to form a passivation layer 120 as illustrated in FIG. 2.

A conductive layer (not shown) is formed on the passivation layer 120, and a photo resist layer (not shown) is formed on the conductive layer. The photo resist layer is patterned to form a photolithography mask (not shown). Then, the conductive layer is patterned through the photolithography mask to form a gate line 130 including a gate electrode 140 and a capacitor line 150 as illustrated in FIG. 4. In an embodiment of the invention, the capacitor line 150 may be overlapped with the data line 110.

An insulation layer is coated on the substrate 100 having the data line 110 to form a gate insulation layer 160 as illustrated in FIG. 4.

A semiconductor material layer (not shown) is formed on the gate insulation layer 160. The semiconductor material layer is patterned by a photolithography process to form a semiconductor layer 170 as illustrated in FIG. 6. In an embodiment of the invention, an ohmic contact layer may be formed on the semiconductor layer 170.

A photo resist layer (not shown) is coated on the semiconductor layer 170 and the gate insulation layer 160. The photo resist layer corresponding to the data line 110 is removed. The gate insulation layer 160 and the passivation layer 120 corresponding to the data line 110 are patterned by a full exposure process so that the data line 110 is exposed. Thus, a contact hole 180 is formed as illustrated in FIG. 8.

A transparent conductive layer (not shown) is formed on the semiconductor layer 170 and the gate insulation layer 160. A photo resist layer is coated on the transparent conductive layer. The photo resist layer is patterned to form a photolithography mask (not shown). Then, the transparent conductive layer is patterned through the photolithography mask to form a source electrode 210 and a drain electrode 220. The source electrode 210 is electrically connected to the data line 110 through the contact hole 180. The drain electrode 220 includes a pixel electrode 230 as illustrated in FIG. 12.

A black matrix 310 is formed on a countering substrate 20. A liquid crystal layer 320 is interposed between the array substrate 10 and the countering substrate 20 as illustrated in FIG. 10.

In an embodiment of the invention, a distance (d) of adjacent pixel electrodes (231, 232) is narrower than a width of the black matrix, a width of the capacitor line and a width of the data line.

According to exemplary embodiments, a display device including the array substrate and the countering substrate can enhance an aperture ratio Although the illustrative embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. An array substrate comprising:
   a substrate;
   a data line formed on the substrate;
   a passivation layer formed on the data line;
   a gate line including a gate electrode and a capacitor line formed on the passivation layer, wherein the capacitor line is overlapped with the data line;
   a gate insulation layer formed on the gate line and the capacitor line;
   a semiconductor layer formed on the gate insulation layer;
   a contact hole formed through the passivation layer and the gate insulation layer to expose the data line; and
   a source electrode and a drain electrode formed on the semiconductor layer and the gate insulation layer,
   wherein the source electrode is connected to the data line through the contact hole, and the source electrode and the drain electrode comprises a transparent conductive material.

2. The array substrate of claim 1, wherein the drain electrode comprises a pixel electrode formed on the gate insulation layer.

3. The array substrate of claim 2, wherein the pixel electrode comprises one of a reflective conductive material, a transflective conductive material, indium tin oxide (ITO) and indium zinc oxide (IZO).

4. The array substrate of claim 1, wherein a width of the capacitor line is wider than a width of the data line.

5. A display device comprising:
   a first substrate, wherein the first substrate comprises:
      a data line formed on a substrate;

a passivation layer formed on the data line;
a gate line including a gate electrode and a capacitor line formed on the passivation layer, wherein the capacitor line is overlapped with the data line;
a gate insulation layer formed on the gate line and the capacitor line;
a semiconductor layer formed on the gate insulation layer;
a contact hole formed through the passivation layer and the gate insulation layer to expose the data line; and
a source electrode and a drain electrode formed on the semiconductor layer,
a second substrate including a black matrix; and
a liquid crystal layer interposed between the first substrate and the second substrate,
wherein the drain electrode comprises a pixel electrode formed on the gate insulation layer, and a distance of adjacent pixel electrodes is narrower than a width of the black matrix, a width of the capacitor line and a width of the data line.

6. The display device of claim 5, wherein the source electrode and the drain electrode comprises a transparent conductive material.

7. The display device of claim 6, wherein the transparent conductive material comprises one of a reflective conductive material, a transflective conductive material, indium tin oxide (ITO) and indium zinc oxide (IZO).

8. The display device of claim 5, wherein a width of the capacitor line is wider than a width of the data line.

* * * * *